(12) United States Patent
Aoki

(10) Patent No.: US 8,530,937 B2
(45) Date of Patent: Sep. 10, 2013

(54) COMPOUND SEMICONDUCTOR DEVICE HAVING INSULATION FILM WITH DIFFERENT FILM THICKNESSES BENEATH ELECTRODES

(75) Inventor: Hironori Aoki, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 34 days.

(21) Appl. No.: 13/298,705

(22) Filed: Nov. 17, 2011

(65) Prior Publication Data

US 2012/0126287 A1    May 24, 2012

(30) Foreign Application Priority Data

Nov. 19, 2010  (JP) ................................. 2010-258799

(51) Int. Cl.
*H01L 29/778*    (2006.01)

(52) U.S. Cl.
USPC ................... 257/192; 257/194; 257/E29.246

(58) Field of Classification Search
CPC ................................................ H01L 29/66462
USPC .................. 257/192, 194, E29.246
See application file for complete search history.

(56) References Cited

U.S. PATENT DOCUMENTS

| 7,075,125 | B2 * | 7/2006 | Saito et al. | 257/194 |
|---|---|---|---|---|
| 7,126,426 | B2 * | 10/2006 | Mishra et al. | 330/307 |
| 7,161,194 | B2 * | 1/2007 | Parikh et al. | 257/194 |
| 7,355,215 | B2 * | 4/2008 | Parikh et al. | 257/194 |
| 7,388,236 | B2 * | 6/2008 | Wu et al. | 257/194 |
| 7,465,967 | B2 * | 12/2008 | Smith et al. | 257/194 |
| 7,550,783 | B2 * | 6/2009 | Wu et al. | 257/194 |
| 7,573,078 | B2 * | 8/2009 | Wu et al. | 257/194 |
| 7,800,131 | B2 * | 9/2010 | Miyamoto et al. | 257/192 |
| 8,120,064 | B2 * | 2/2012 | Parikh et al. | 257/192 |
| 8,283,699 | B2 * | 10/2012 | Wu | 257/192 |
| 2005/0253167 | A1 * | 11/2005 | Wu et al. | 257/192 |
| 2006/0043415 | A1 * | 3/2006 | Okamoto et al. | 257/192 |
| 2006/0118809 | A1 * | 6/2006 | Parikh et al. | 257/103 |
| 2007/0224710 | A1 * | 9/2007 | Palacios et al. | 438/12 |
| 2007/0228497 | A1 * | 10/2007 | Shimizu | 257/409 |
| 2008/0073670 | A1 * | 3/2008 | Yang et al. | 257/194 |

(Continued)

FOREIGN PATENT DOCUMENTS

JP    2005-93864    4/2005

OTHER PUBLICATIONS

U.S. Appl. No. 13/204,968, filed Aug. 8, 2011, Aoki.
U.S. Appl. No. 13/210,950, filed Aug. 16, 2011, Iwabuchi, et al.
U.S. Appl. No. 13/251,563, filed Oct. 3, 2011, Iwabuchi, et al.

*Primary Examiner* — Evan Pert
(74) *Attorney, Agent, or Firm* — Oblon, Spivak, McClelland, Maier & Neustadt, L.L.P.

(57) ABSTRACT

A compound semiconductor device includes a group-III nitride semiconductor layer; an insulation film located on the group-III nitride semiconductor layer; a drain electrode located in a position which is a first distance away from an upper surface of the group-III nitride semiconductor layer; a source electrode located in a position which is the first distance away from the upper surface of the group-III nitride semiconductor layer; a gate electrode located between the drain electrode and the source electrode; and a field plate electrode located between the drain electrode and the gate electrode at a position which is a second distance away from the upper surface of the group-III nitride semiconductor layer, the second distance is shorter than the first distance.

5 Claims, 6 Drawing Sheets

(56) References Cited

U.S. PATENT DOCUMENTS

| | | | |
|---|---|---|---|
| 2008/0272443 A1* | 11/2008 | Hoshi et al. | 257/409 |
| 2009/0230430 A1* | 9/2009 | Miyamoto et al. | 257/192 |
| 2009/0261384 A1* | 10/2009 | Yang et al. | 257/194 |

* cited by examiner

US 8,530,937 B2

COMPOUND SEMICONDUCTOR DEVICE HAVING INSULATION FILM WITH DIFFERENT FILM THICKNESSES BENEATH ELECTRODES

CROSS REFERENCE TO RELATED APPLICATIONS AND INCORPORATION BY REFERENCE

This application is based upon and claims the benefit of priority from prior Japanese Patent Application P2010-258799 filed on Nov. 19, 2010; the entire contents of which are incorporated by reference herein.

BACKGROUND OF THE INVENTION

1. Field of the Invention

The present invention relates to a compound semiconductor device having a field plate electrode.

2. Description of the Related Art

A compound semiconductor device using a group-III nitride semiconductor is used for a high-voltage power device and the like. Atypical group-III nitride semiconductor is expressed as $Al_xIn_yGa_{1-x-y}N$ ($0</=x</=1, 0</=y</=1, 0</=x+y</=1$), and includes gallium nitride (GaN), aluminum nitride (AlN), and indium nitride (InN). For example, for a high-electron-mobility transistor (HEMT), a hetero junction surface is formed in an interface between a carrier travel layer and a carrier supply layer which are made of the group-III nitride semiconductor with different bandgap energies from each other. In the carrier travel layer near the hetero junction surface, a two dimensional carrier gas layer is formed as a current path (channel).

A bias electric field generated when a voltage is applied between a drain electrode and a source electrode of a compound semiconductor device concentrates in an end portion of the gate electrode on the side of the drain electrode (hereinafter, referred to as a drain-side end portion). By alleviating the concentration of the bias electric field in the drain-side end portion of the gate electrode, the voltage resistance of the compound semiconductor device can be improved. For example, a method is proposed for easing electric field concentration in the drain-side end portion of the gate electrode by arranging a field plate electrode.

In forming electrodes such as a drain electrode on an insulation film formed on a group-III nitride semiconductor layer, opening portions are made in the insulation film. Then, in order to connect the respective electrodes and the group-III nitride semiconductor layer, the electrodes are located in the opening portions respectively. At this time, an area of each of the electrodes is formed wider than the corresponding opening portion to secure process margin in the semiconductor manufacturing process. As a result, an area where the each of the electrodes and the group-III nitride semiconductor layer face each other across the insulation film (hereinafter referred to as a flange portion) is formed. The flange portion functions as a field plate electrode.

It is known that a field plate electrode electrically connected to a drain electrode worsens current collapse. Therefore, in order to decrease the function of a flange portion of a drain electrode as a field plate electrode, a film thickness of an insulation film on a group-III nitride semiconductor layer needed to be increased. In this case, however, a problem arose that an effect to alleviate electric field concentration due to a conventional field plate electrode was reduced.

SUMMARY OF THE INVENTION

An aspect of the present invention inheres in a compound semiconductor device. The compound semiconductor device includes a group-III nitride semiconductor layer in which a carrier supply layer and a carrier travel layer forming a hetero junction with the carrier supply layer are laminated; an insulation film located on the group-III nitride semiconductor layer; a drain electrode located in a position which is a first distance away from an upper surface of the group-III nitride semiconductor layer in a film thickness direction across the insulation film and contacts the group-III nitride semiconductor layer in an opening portion provided in the insulation film; a source electrode located in a position which is the first distance away from the upper surface of the group-III nitride semiconductor layer in the film thickness direction across the insulation film and contacts the group-III nitride semiconductor layer in an opening portion provided in the insulation film; a gate electrode located between the drain electrode and the source electrode; and a field plate electrode located between the drain electrode and the gate electrode at a position which is a second distance away from the upper surface of the group-III nitride semiconductor layer in the film thickness direction across the insulation film, the second distance being shorter than the first distance.

DETAILED DESCRIPTION OF THE INVENTION

Figure 1:
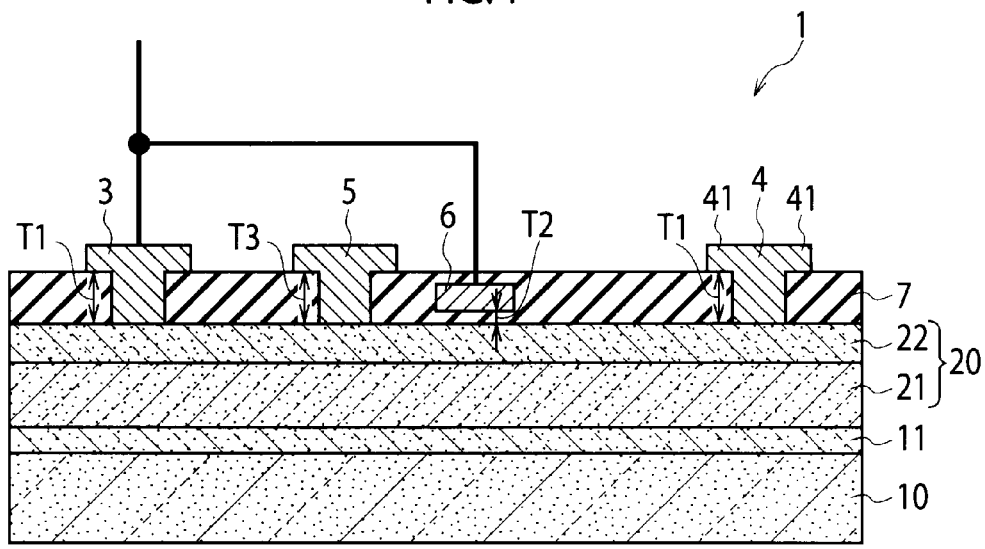
FIG. 1 is schematic cross-sectional view showing a structure of a compound semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the pre sent invention. However, it will be obvious to those skilled in the art that the present invention may be practiced without such specific details. In other instances, well-known circuits have been shown in block diagram form in order not to obscure the present invention in unnecessary detail.

First Embodiment

As illustrated in FIG. 1, a compound semiconductor device 1 according to the first embodiment of the present invention includes a group-III nitride semiconductor layer 20 in which a carrier supply layer 22 and a carrier travel layer 21 which forms a hetero junction with the carrier supply layer 22 are laminated, an insulation film 7 located on the group-III nitride semiconductor layer 20, a source electrode 3, a drain electrode 4, and a gate electrode 5. The drain electrode 4 is located at a position which is a first distance T1 away from the top surface of the group-III nitride semiconductor layer 20 in the film thickness direction through the insulation film 7. The source electrode 3 is located at a position which is the first distance Ti away from the top surface of the group-III nitride semiconductor layer 20 in the film-thickness direction through the insulation film 7. The gate electrode 5 is located between the source electrode 3 and the drain electrode 4 at a position which is a third distance T3 away from the top surface of the group-III nitride semiconductor layer 20 in the film-thickness direction through the insulation film 7. The source electrode 3, the drain electrode 4 and the gate electrode 5 are in contact with the group-III nitride semiconductor layer 20 respectively through opening portions provided in the insulation film 7. In addition, a field plate electrode 6 is located between the drain electrode 4 and the gate electrode 5 at a position which is a second distance T2 away from the top surface of the group-III nitride semiconductor layer 20 in the film-thickness direction through the insulation film 7. The second distance T2 is shorter than the first distance Ti. The field plate electrode 6 is electrically connected to the source electrode 3.

As depicted in FIG. 1, a buffer layer 11 is arranged on a substrate 10, and the group-III nitride semiconductor layer 20 is arranged on top of the buffer layer 11.

The group-III nitride semiconductor layer 20 includes the carrier supply layer 22 composed of a first group-III nitride semiconductor layer, and the carrier travel layer 21 composed of a second group-III nitride semiconductor layer having different bandgap energy from the first group-III nitride semiconductor layer.

The carrier travel layer 21 located on the buffer layer 11 is formed by, for example, epitaxial growth of undoped GaN having no added impurity by means of metal-organic chemical vapor deposition (MOCVD) or the like. The expression "undoped" here means that no impurity is added purposely.

The carrier supply layer 22 located on the carrier travel layer 21 has a larger bandgap than the carrier travel layer 21 and is also made of group-III nitride semiconductor with a smaller lattice constant than that of the carrier travel layer 21. Undoped $Al_xGa_{1-x}N$ may be used as the carrier supply layer 22.

The carrier supply layer 22 is formed on the carrier travel layer 21 by epitaxial growth by means of the MOCVD or the like. Since the carrier supply layer 22 and the carrier travel layer 21 have different lattice constants from each other, piezoelectric polarization occurs due to a lattice distortion. Because of this piezoelectric polarization, as well as spontaneous polarization of the crystal of the carrier supply layer 22, high-density carrier is generated in the carrier travel layer 21 in the vicinity of the hetero junction, and a two-dimensional carrier gas layer (not illustrated) serving as a current path (channel) is formed. This means that the compound semiconductor device 1 is a HEMT using group-III nitride semiconductor.

In the compound semiconductor device 1, the field plate electrode 6 is arranged between the gate electrode 5 and the drain electrode 4. Because of the field plate electrode 6, a curvature of a depletion layer in the drain-side end portion of the gate electrode 5 is controlled, thus easing concentration of bias electrical field in the drain-side end portion of the gate electrode 5.

As explained above, the field plate electrode electrically connected to the drain electrode 4 worsens current collapse, inducing an increase of on-resistance. Also, a flange portion 41 of the drain electrode 4 facing the group-III nitride semiconductor layer 20 across the insulation film 7 works as a field plate electrode which is electrically connected to the drain electrode 4.

However, in the compound semiconductor device 1 shown in FIG. 1, the film thickness of the insulation film 7 between the flange portion 41 of the drain electrode 4 and the group-III nitride semiconductor layer 20 is larger than the film thickness of the insulation film 7 between the field plate electrode 6 and the group-III nitride semiconductor layer 20. Hence, in the compound semiconductor device 1, the function of the flange portion 41 as a field plate electrode is reduced by increasing the thickness of the insulation film 7 immediately beneath the flange portion 41 of the drain electrode 4. Meanwhile, by reducing the thickness of the insulation film 7 immediately beneath the field plate electrode 6, degradation of an effect to alleviate electric field concentration due to the field plate electrode 6 can be inhibited.

In order to reduce the function of the flange portion 41 of the drain electrode 4 as a field plate electrode, the film thickness of the insulation film 7 directly beneath the flange portion 41, in other words, the first distance T1, is preferably, for example, between around 500 nm and 1 μm. On the other hand, the film thickness of the insulation film 7 directly beneath the field plate electrode 6, in other words, the second distance T2, is preferably, for example, between around 100 nm and 300 nm in order to inhibit degradation of the effect to ease electric field concentration due to the field plate electrode 6.

The film thickness (T3) of the insulation film 7 between the flange portion of the gate electrode 5 and the group-III nitride semiconductor layer 20 may be nearly equal to the film thickness (T2) of the insulation film 7 between the field plate electrode 6 and the group-III nitride semiconductor layer 20. In this case, T2=T3<T1. Having said that, by making the film thickness (T3) of the insulation film 7 directly beneath the flange portion of the gate electrode 5 larger than the film thickness (T2) of the insulation film 7 immediately beneath the field plate electrode 6, the gate-drain capacitance of the compound semiconductor device 1 can be reduced. Thus, it is preferred that the third distance T3 is nearly equal to the first distance T1.

Figure 2:
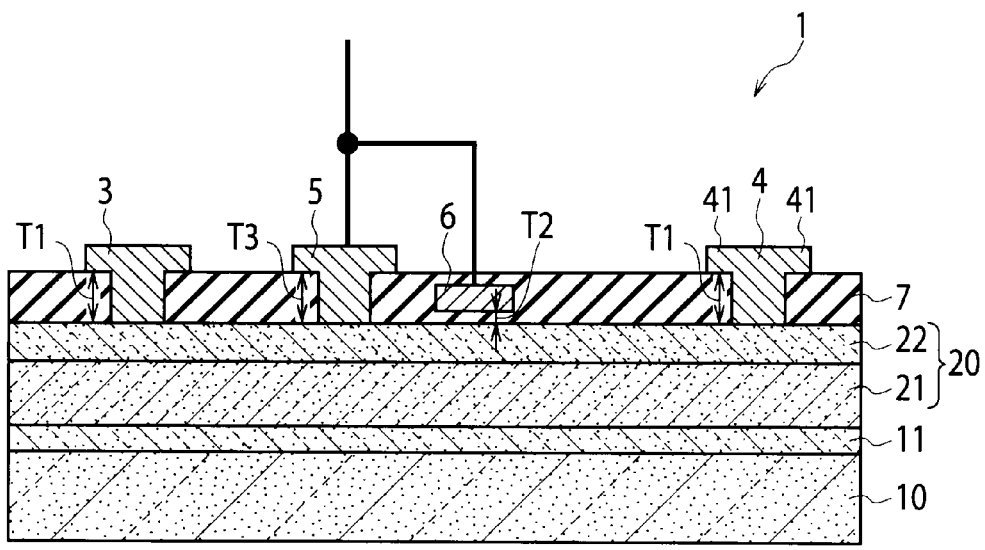
FIG. 2 is schematic cross-sectional view showing another structure of the compound semiconductor device according to the first embodiment of the present invention.

Even when the field plate electrode 6 is electrically connected to the gate electrode 5 as shown in FIG. 2, electric field concentration in the drain-side end portion of the gate electrode 5 due to the field plate electrode 6 can be mitigated as well.

As explained so far, in the compound semiconductor device 1 according to the first embodiment of the present invention, by increasing the film thickness (T1) of the insulation film 7 immediately beneath the flange portion 41 of the drain electrode 4 and reducing the film thickness (T2) of the insulation film 7 immediately beneath the field plate electrode 6, the function of the flange portion 41 of the drain electrode 4 as a field plate electrode is impaired, and, at the same time, deterioration of the effect to ease electric field concentration due to the field plate electrode 6 is suppressed. As a result, the compound semiconductor device 1 can be provided in which current collapse and effect mitigation due to the field plate electrode 6 are suppressed. That is, according to the compound semiconductor device 1 shown in FIG. 1, one can provide a compound semiconductor device in which concentration of bias electrical field in the drain-side end portion of the gate electrode 5 is eased and an increase of on-resistance is suppressed while operating.

Explained below with reference to FIGS. 3 to 9 is a manufacturing method of the compound semiconductor device 1 according to the first embodiment of the present invention. What will be described here will be an exemplification of a manufacturing method for the compound semiconductor device a illustrated in FIG. 1, and it should be naturally understood that it is feasible to realize the compound semiconductor device using various other manufacturing methods including modifications thereof.

Figure 3:
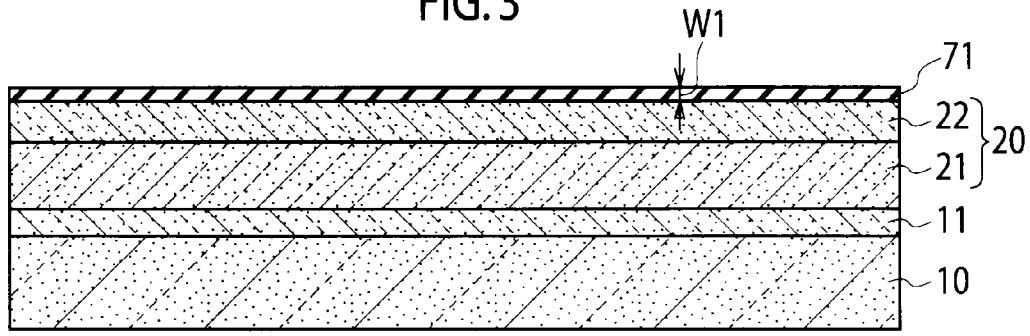
FIGS. 3 to 9 are cross-sectional views of process steps explaining how to manufacture the compound semiconductor device according to the first embodiment of the present invention.

(a) As shown in FIG. 3, the buffer layer 11 is formed on the substrate 10. Further, the carrier travel layer 21 and the carrier supply layer 22 are formed in this order by means of epitaxial growth on the buffer layer 11, forming the group-III nitride semiconductor layer 20. Furthermore, on the carrier supply layer 22, a first insulation film 71 made of, for example, a silicon (SiN) film, is formed with a film thickness W1. Here, the film thickness W1 is equal to the second distance T2. The first insulation film 71 is a lower part of the insulation film 7.

Figure 4:
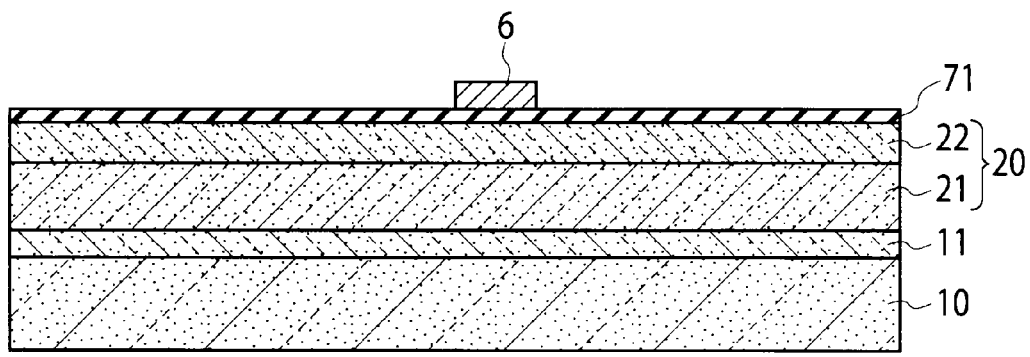

(b) After forming a metallic film on the entire top surface of the first insulating film 71 for making the field plate electrode 6, the metallic film is patterned using a photolithographic technique or the like. As a result, as illustrated in FIG. 4, the field plate electrode 6 is formed at a predetermined position on the first insulating film 71, which is between a position where the drain electrode 4 will be located and a position where the gate electrode 5 is located.

Figure 5:
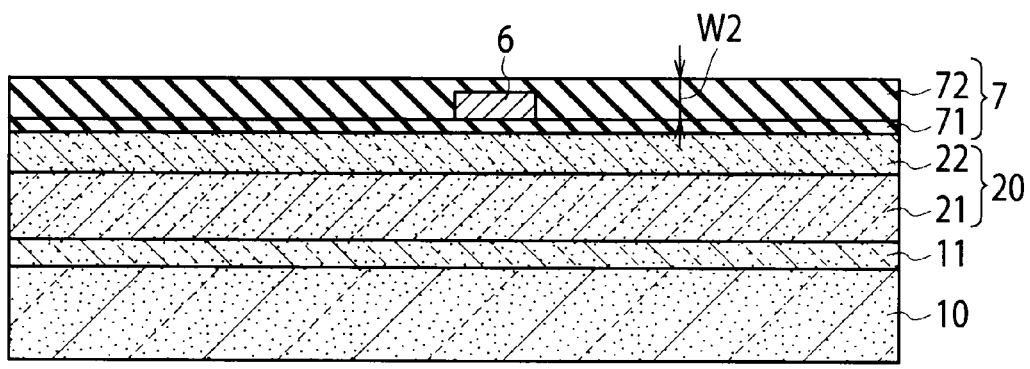

(c) As shown in FIG. 5, on top of the first insulation film 71 and the field plate electrode 6, a second insulation film 72 made of, for example, oxide silicon ($SiO_2$), is formed with a film thickness W2. The second insulation film 72 may also be a SiO film, a SiN film, or an aluminum oxide ($AL_2O_3$) film. The second insulation film 72 is an upper part of the insulation film 7, and the film thickness W2 is equal to the difference between the first distance T1 and the second distance T2. Here, the film thickness (T1) of the insulation film 7 below the flange portion 41 of the drain electrode 4 and the flange portion of the source electrode 3, and the film thickness (T3) of the insulation film 7 below the flange portion of the gate electrode 5 are the same.

Figure 6:
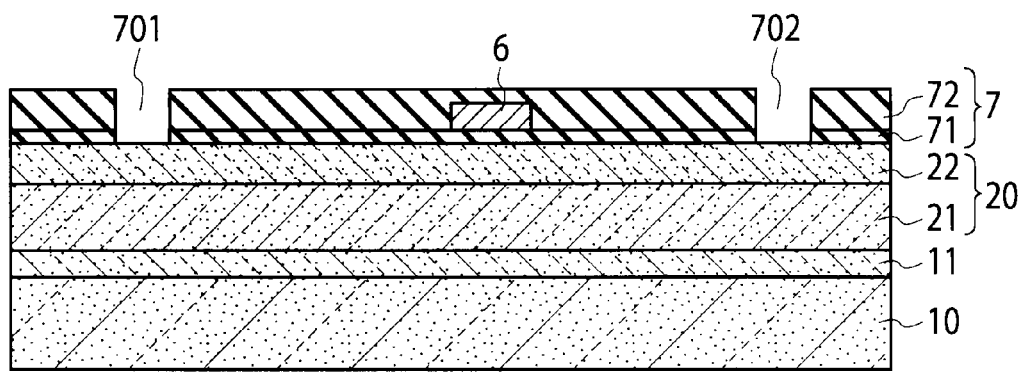

(d) As depicted in FIG. 6, opening portions 701 and 702 are formed at given positions of the first insulation film 71 and the second insulation film 72 by using a photolithography technique or the like. More specifically, the first insulation film 71 and the second insulation film 72 are etched using a photoresist film as an etching mask at the positions where the source electrode 3 and the drain electrode 4 will be respectively located.

Figure 7:
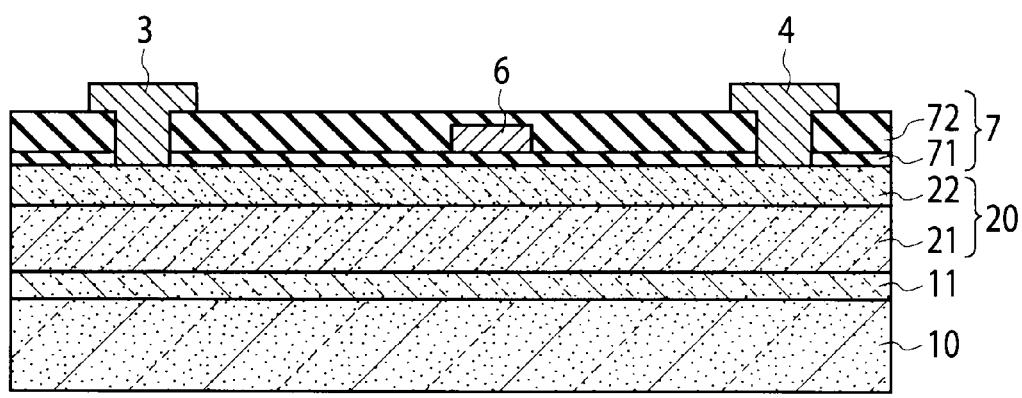

(e) A metallic film is formed on the second insulation film 72, plugging the opening portions 701 and 702. Thereafter, the metallic film is patterned using a photolithography technique or the like. Thus, as shown in FIG. 7, the source electrode 3 is formed in the location where the opening 701 is plugged and the gate electrode 5 is formed in the location where the opening 702 is plugged.

Figure 8:
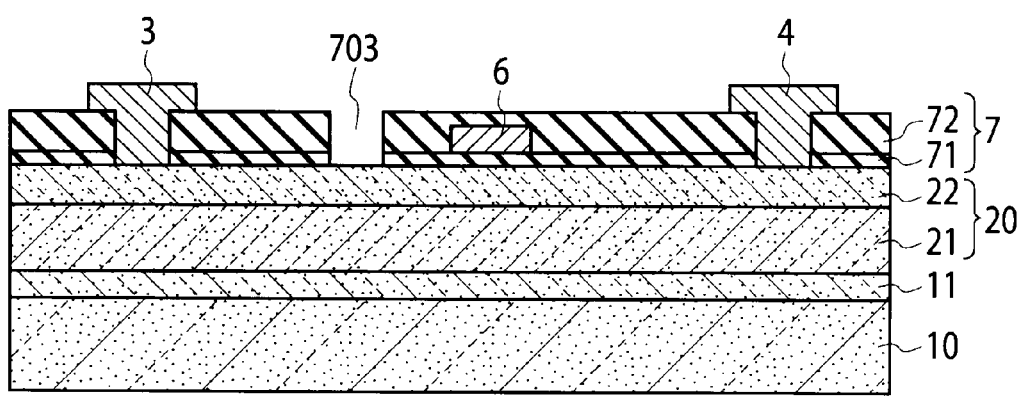
Figure 9:
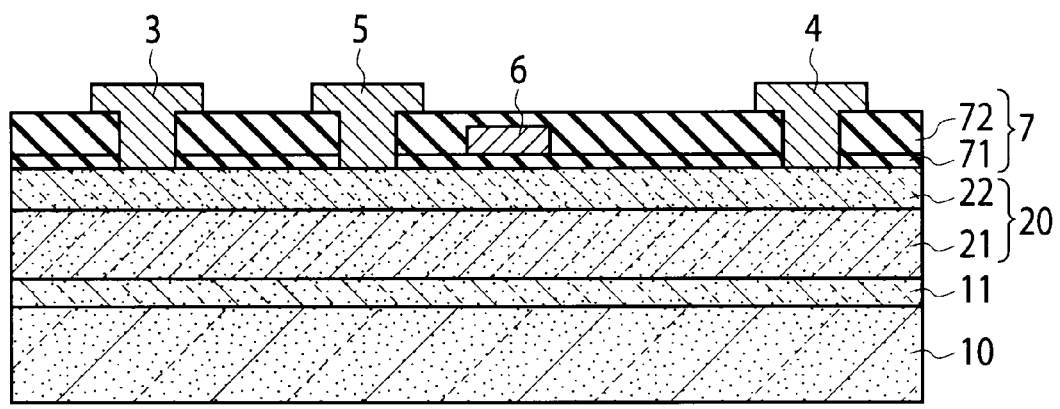

(f) As illustrated in FIG. 8, an opening portion 703 is formed by removing the first insulation film 71 and the second insulation film 72 at a position where the gate electrode 5 will be arranged. Then, after forming a metallic film on the second insulation film 72 to plug the opening 703, the metallic film is patterned and the gate electrode 5 is created in the location where the opening 703 is plugged as shown in FIG. 9. The gate electrode 5 may also be formed by using a liftoff technique.

(g) Thereafter, the field plate electrode 6 and the source electrode 3 are electrically connected to each other using a known multilayer interconnection process, which completes the compound semiconductor device 1 shown in FIG. 1.

In the example shown in FIG. 1, the outer edge portion of the gate electrode 5 is located on the insulation film 7 so that the gate electrode 5 has the flange portion. However, the compound semiconductor device 1 may also be manufactured so that the gate electrode 5 has no flange portion.

For the substrate 10, a semiconductor substrate such as a silicon (Si) substrate, a silicon carbide (SiC) substrate, and a GaN substrate, or an insulator substrate such as a sapphire substrate and a ceramic substrate may be used. For instance, by using a silicon substrate which can be easily made with a large diameter for the substrate 10, manufacturing costs of the compound semiconductor device 1 can be reduced.

The buffer layer 11 can be formed by epitaxial growth such as the MOCVD method or the like. Although the buffer layer 11 is illustrated as a single layer in FIG. 1, the buffer layer 11 may also be formed of a plurality of layers. For example, the buffer layer 11 may be a multilayered buffer in which the first sublayer made of aluminum nitride (AlN) and the second sublayer made of GaN are stacked alternately. Note that the buffer layer 11 may be omitted because the buffer layer 11 is not directly related to the operation of the HEMT. Also, the combination of the substrate 10 and the buffer layer 11 may be regarded as a substrate. The structure and positioning of the buffer layer 11 are determined in accordance with the material and other elements of the substrate 10.

The source electrode 3 and the drain electrode 4 are formed of metal which can have low resistance contact (ohmic contact) with the group-III nitride semiconductor layer 20. For example, aluminum (Al), titanium (Ti) and the like may be utilized for the source electrode 3 and the drain electrode 4. Alternatively, the source electrode 3 and the drain electrode 4 are formed as a laminated body of Ti and Al.

For the gate electrode 5, nickel-gold (NiAu) or the like may be used. For the field plate electrode 6, aluminum (Al), titanium (Ti) and the like may be used.

As explained so far, according to the manufacturing method of the compound semiconductor substrate 1 in the first embodiment of the present invention, the film thickness (T1) of the insulation film 7 immediately beneath the flange portion 41 of the drain electrode 4 is larger than the film thickness (T2) of the insulation film 7 immediately beneath the field plate electrode 6. Therefore, one can provide the compound semiconductor device 1 which controls current collapse and suppresses deterioration of an effect to alleviate electric field concentration caused by the field plate electrode 6.

<Modification>

Figure 10:
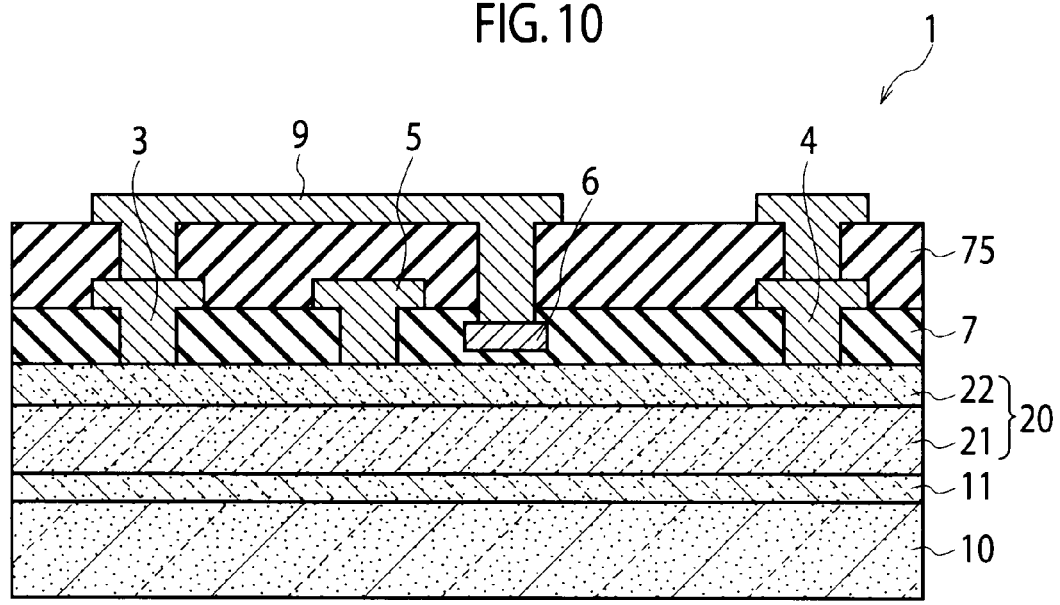
FIG. 10 is a schematic cross-sectional view showing a structure of a compound semiconductor device according to a modification of the first embodiment of the present invention.

As depicted in FIG. 10, the source electrode 3 and the field plate electrode 6 may be formed in an integrated manner. Specifically, the compound semiconductor device 1 shown in FIG. 10 is realized by forming a wiring layer 9 which plugs the opening portions formed in an interlayer insulating film 75 and the insulation film 7. In this case, it is not necessary to electrically connect the source electrode 3 and the field plate electrode 6 by multilayer interconnection process.

Note that, by electrically connecting the field plate electrode 6 to the source electrode 3, the miller capacitance of the compound semiconductor device 1 can be reduced. This is because the gate electrode 5 is shielded with respect to the drain electrode 4 by the field plate electrode 6 which is electrically connected to the source electrode 3. This means that the capacitance between the gate electrode 5 and the drain electrode 4 is reduced because the field plate electrode 6 is arranged between the gate electrode 5 and the drain electrode 4.

Thus, by electrically connecting the field plate electrode 6 to the source electrode 3, a high-speed operation of the compound semiconductor device 1 is enabled. Hereinafter, the effect on reduction of miller capacitance by shielding the gate electrode 5 against the drain electrode 4 will be referred to as a shielding effect.

In the example shown in FIG. 10, the side surface of the gate electrode 5 facing the drain electrode 4 is shielded by the field plate electrode 6 and the wiring layer 9 which connects the field plate electrode 6 and the source electrode 3. Therefore, due to the shielding effect, the capacitance between the gate electrode 5 and the drain electrode 4 is reduced, thus enabling to reduce the miller capacitance of the compound semiconductor device 1.

Figure 11:
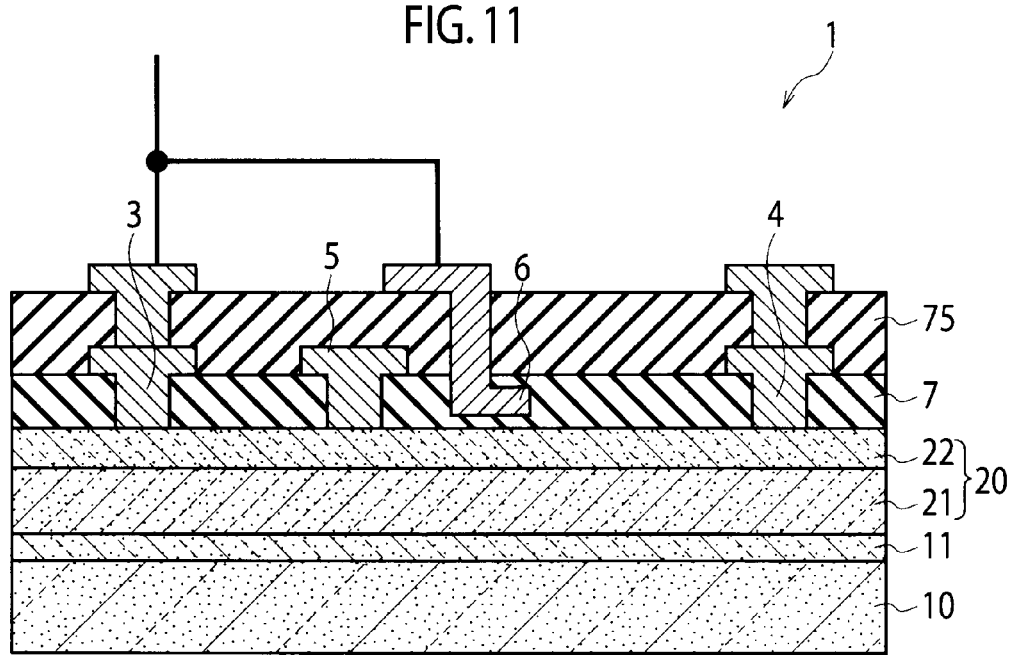
FIG. 11 is a schematic cross-sectional view showing a structure of a compound semiconductor device according to another modification of the first embodiment of the present invention.

In order to have the shielding effect due to the field plate electrode 6, the field plate electrode 6 may be formed to cover an area up to a part of an upper surface of the gate electrode 5 on the side of the drain electrode 4 as shown in FIG. 11. Alternatively, as illustrated in FIG. 12, the field plate electrode 6 may be formed integrally with the gate electrode 5.

Figure 12:
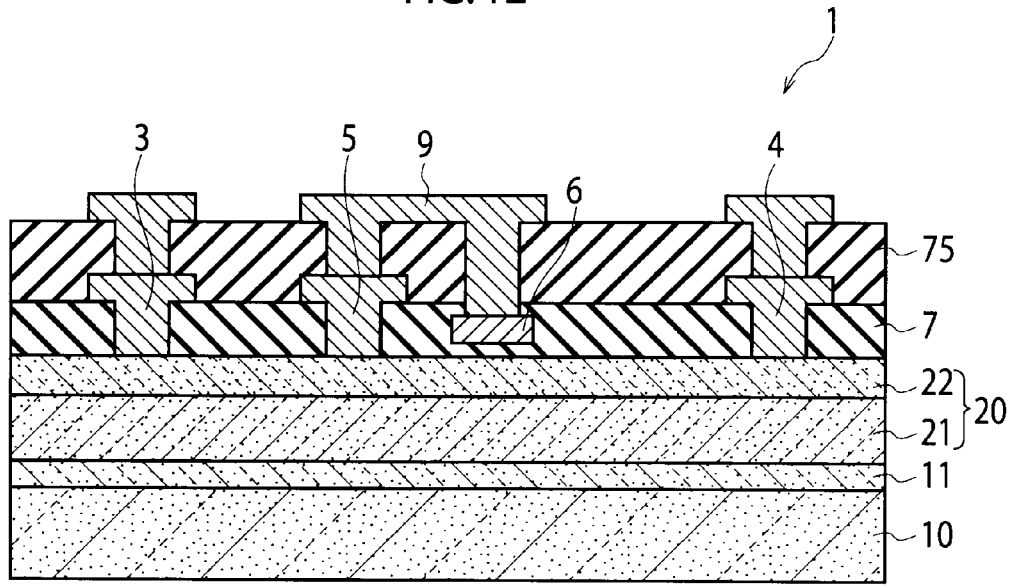
FIG. 12 is a schematic cross-sectional view showing a structure of a compound semiconductor device according to more another modification of the first embodiment of the present invention.

According to the compound semiconductor device 1 shown in FIGS. 11 and 12, current collapse is also controlled, and deterioration of the effect to alleviate electric field concentration in the drain-side end portion of the gate electrode 5 can also be suppressed. In addition, the shielding effect can be obtained.

Second Embodiment

Figure 13:
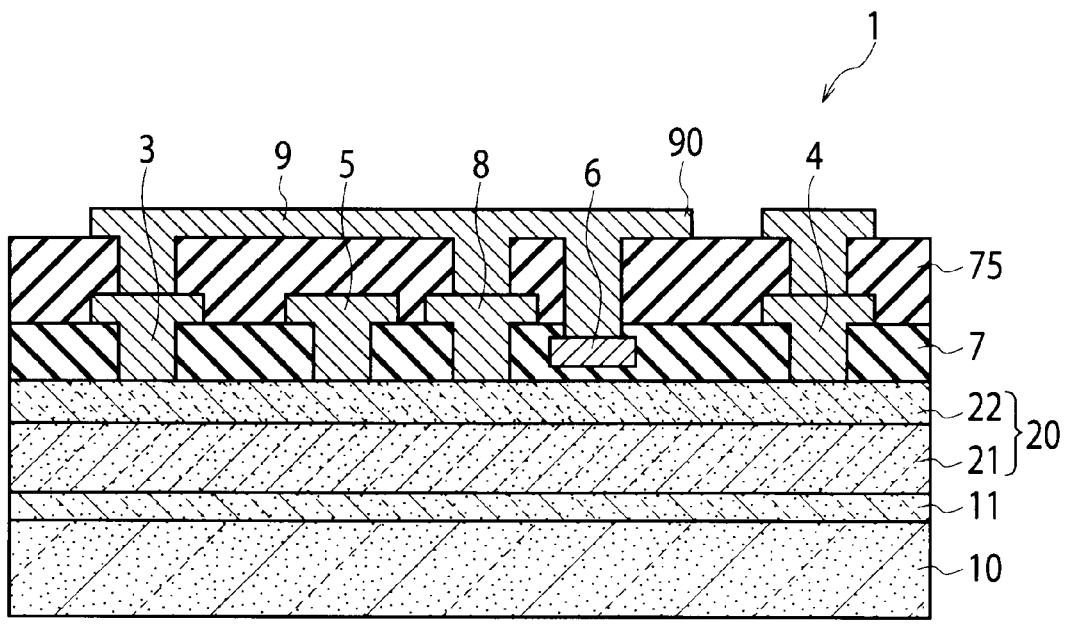
FIG. 13 is a schematic cross-sectional view showing a structure of a compound semiconductor device according to a second embodiment of the present invention.

As illustrated in FIG. 13, a compound semiconductor device 1 according to the second embodiment of the present invention is different from the compound semiconductor device 1 shown in FIG. 1 in that a shield electrode 8 is further provided on a group-III nitride semiconductor layer 20 between and in the adjacent to a gate electrode 5 and a field plate electrode 6. As seen in FIG. 13, the shield electrode 8 is electrically connected to the field plate electrode 6. Also, the shield electrode 8 and the field plate electrode 6 are electrically connected to a source electrode 3. The rest of the structure is similar to the first embodiment illustrated in FIG. 1.

The structure of the shield electrode 8 may be similar to that of, for example, the gate electrode 5. FIG. 13 shows an example where the outer edge portion of the shield electrode 8 is located on an insulation film 7 so that the shield electrode 8 has a flange portion. However, the shield electrode 8 does not necessarily have to have the flange portion. The gate electrode 5 does not need to have a flange portion either.

According to the compound semiconductor device 1 shown in FIG. 13, by arranging the shield electrode 8 between the gate electrode 5 and the drain electrode 4, electric field concentration in a drain-side end portion of the gate electrode 5 is eased farther than the compound semiconductor device 1 of the first embodiment. Moreover, by locating the field plate electrode 6 between the shield electrode 8 and the drain electrode 4, electric field concentration in a drain-side end portion of the shield electrode 8 is alleviated. Therefore, breaking of the shield electrode 8 can be prevented.

As illustrated in FIG. 13, a wiring layer 9 which electrically connect the shield electrode 8 and the field plate electrode 6 to the source electrode 3 may be extended toward the drain electrode 4 after passing above the field plate electrode 6. The extended portion 90 of the wiring layer 9 toward the drain electrode 4 enables to further ease electric field concentration in the shield electrode 8.

In the compound semiconductor device 1 shown in FIG. 13, the film thickness of the insulation film 7 immediately beneath the flange portion 41 of the drain electrode 4 is smaller than the film thickness of the insulation film 7 immediately beneath the field plate electrode 6. Thus, the function of the flange portion 41 of the drain electrode 4 as a field plate electrode is reduced, and, at the same time, deterioration of an effect to ease electric field concentration due to the field plate electrode 6 can be suppressed.

Further, in the compound semiconductor device 1 having the shield electrode 8 shown in FIG. 13, the effect to shield the gate electrode 5 with respect to the drain electrode 4 is greater than that of the compound semiconductor device 1 according to the first embodiment. Note that it is preferred that the height from the upper surface of the group-III nitride semiconductor layer 20 to the upper surface of the shield electrode 8 be set equal to or larger than the height up to the upper surface of the gate electrode 5. Thus, the entire side surface of the gate electrode 5 facing the drain electrode 4 is shielded by the shield electrode 8. Because of the shielding effect of the shield electrode 8, the capacitance between the gate electrode 5 and the drain electrode 4 is reduced, thus decreasing the miller capacitance of the compound semiconductor device 1.

The manufacturing process can be simplified by forming the shield electrode 8 into the same structure using the same material as the gate electrode 5. This means that the shield electrode 8 may be formed at the same time as forming the gate electrode 5 in the process steps explained with reference to FIGS. 5 and 6.

As explained so far, according to the compound semiconductor device 1 of the second embodiment of the present invention, electric field concentration in the drain-side end portion in the gate electrode 5 can be eased more effectively, and, at the same time, the miller capacitance of the compound semiconductor device 1 can be reduced more efficiently. The rest is substantially the same as the first embodiment, and thus the description thereof will be omitted.

Other Embodiments

A field plate electrode 6 may be connected to a fixed electrode (other than a source electrode 3 or a gate electrode 5) which supplies a certain fixed voltage. By setting the field plate electrode 6 to a certain potential which looks like GND in alternate electric current, electric field concentration in a drain-side end portion of the gate electrode 5 can be alleviated. The field plate electrode 6 may also be connected to GND.

The gate electrode structure of the compound semiconductor device 1 described above is a MES structure where the gate electrode 5 and group-III nitride semiconductor layer 20 have a Schottoky barrier junction. However, the electrode structure of the gate electrode 5 may also be a MIS structure having a gate insulation film which junctions with the group-III nitride semiconductor layer 20.

Various modifications will become possible for those skilled in the art after receiving the teachings of the present disclosure without departing from the scope thereof.

What is claimed is:

1. A compound semiconductor device comprising:
a group-III nitride semiconductor layer in which a carrier supply layer and a carrier travel layer forming a hetero junction with the carrier supply layer are laminated;
an insulation film located on the group-III nitride semiconductor layer;
a drain electrode that includes a flange, which is located in a position which is a first distance away from an upper surface of the group-III nitride semiconductor layer in a film thickness direction across the insulation film and contacts the group-III nitride semiconductor layer in an opening portion provided in the insulation film;

a source electrode that includes a flange, which is located in a position which is the first distance away from the upper surface of the group-III nitride semiconductor layer in the film thickness direction across the insulation film and contacts the group-III nitride semiconductor layer in an opening portion provided in the insulation film;

a gate electrode located between the drain electrode and the source electrode; and a field plate electrode located between the drain electrode and the gate electrode at a position wherein a bottom surface of the field plate electrode is a second distance away from the upper surface of the group-III nitride semiconductor layer in the film thickness direction across the insulation film, the second distance being shorter than the first distance.

2. The compound semiconductor device according to claim 1, wherein the field plate electrode is electrically connected to either any one of the source electrode, the gate electrode and a fixed electrode.

3. The compound semiconductor device according to claim 1, wherein the gate electrode includes a flange that is located in a position which is a third distance away from the upper surface of the group-III nitride semiconductor layer in the film thickness direction across the insulation film, the third distance being greater than the second distance.

4. The compound semiconductor device according to claim 1, further comprising a shield electrode located adjacent to the group-III nitride semiconductor layer between the gate electrode and the field plate electrode.

5. The compound semiconductor device according to claim 4, wherein the shield electrode is electrically connected to the source electrode.

* * * * *